(12) United States Patent
Purkl et al.

(10) Patent No.: US 9,257,587 B2
(45) Date of Patent: Feb. 9, 2016

(54) SUSPENSION AND ABSORBER STRUCTURE FOR BOLOMETER

(71) Applicant: Robert Bosch GmbH, Stuttgart (DE)

(72) Inventors: Fabian Purkl, Palo Alto, CA (US);
Gary Yama, Mountain View, CA (US);
Ando Lars Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/109,929

(22) Filed: Dec. 17, 2013

(65) Prior Publication Data

US 2014/0175588 A1    Jun. 26, 2014

Related U.S. Application Data

(60) Provisional application No. 61/745,138, filed on Dec. 21, 2012.

(51) Int. Cl.
| | |
|---|---|
| *H01L 31/101* | (2006.01) |
| *G01J 5/20* | (2006.01) |
| *G01J 5/08* | (2006.01) |
| *H01L 31/0232* | (2014.01) |

(52) U.S. Cl.
CPC ............. *H01L 31/101* (2013.01); *G01J 5/0853* (2013.01); *G01J 5/20* (2013.01); *H01L 31/02327* (2013.01)

(58) Field of Classification Search
CPC ..... H01L 31/18; H01L 31/101; H01L 41/113; H01L 41/125; H01L 41/0825; H01L 41/1132; H01L 41/1134; H01L 2224/7592; H01L 2224/75925
See application file for complete search history.

(56) References Cited

U.S. PATENT DOCUMENTS

| | | | |
|---|---|---|---|
| 6,242,738 B1 | 6/2001 | Ju | |
| 6,316,770 B1* | 11/2001 | Ouvrier-Buffet et al. | 250/338.1 |
| 2003/0132386 A1* | 7/2003 | Carr et al. | 250/338.1 |
| 2004/0166603 A1* | 8/2004 | Carley | 438/52 |
| 2007/0298534 A1* | 12/2007 | Ikushima et al. | 438/57 |
| 2008/0135758 A1* | 6/2008 | Yang et al. | 250/338.1 |

(Continued)

FOREIGN PATENT DOCUMENTS

| | | |
|---|---|---|
| WO | 0075616 A1 | 12/2000 |
| WO | 2009026505 A1 | 2/2009 |

OTHER PUBLICATIONS

International Search Report and Written Opinion corresponding to PCT Application No. PCT/US2013/076216, mailed Sep. 5, 2014 (12 pages).

(Continued)

*Primary Examiner* — Selim Ahmed
*Assistant Examiner* — Wasiul Haider
(74) *Attorney, Agent, or Firm* — Maginot Moore & Beck LLP

(57) ABSTRACT

A semiconductor device includes a substrate having an upper surface that defines a sensing region. A fixed beam structure is supported at a first level above the sensing region. The fixed beam structure includes fixed beam supports that extend upwardly from the upper surface of the substrate to position the fixed beam structure at the first level above the sensing region. An absorber structure is supported above the fixed beam structure at a second level above the sensing region. The absorber structure includes a pillar support that extends upwardly from the fixed beam structure to position the absorber structure at the second level above the sensing region.

12 Claims, 2 Drawing Sheets

(56) References Cited

U.S. PATENT DOCUMENTS

2009/0152467 A1* 6/2009 Cheon et al. .............. 250/338.4
2010/0171190 A1* 7/2010 Liger ........................... 257/428

OTHER PUBLICATIONS

Yoneoka, S. et al., "ALD-Metal Uncooled Bolometer", IEEE 24th International Conference on Micro Electro Mechanical Systems (MEMS 2011), Jan. 23, 2011, pp. 676-679 (4 pages).

* cited by examiner

SUSPENSION AND ABSORBER STRUCTURE FOR BOLOMETER

CROSS-REFERENCE TO RELATED APPLICATIONS

This application claims priority to U.S. Provisional Application Ser. No. 61/745,138 entitled "SUSPENSION AND ABSORBER STRUCTURE FOR BOLOMETER" by Fabian Purkl et al., filed Dec. 21, 2012, the disclosure of which is hereby incorporated herein by reference in its entirety.

TECHNICAL FIELD

This disclosure relates generally to infrared radiation sensors, and in particular to bolometer infrared radiation sensors.

BACKGROUND

In general, infrared radiation (IR) sensors are used in a variety of applications to detect infrared radiation and provide an electrical output that is a measure of the incident infrared radiation. One type of infrared sensor is a bolometer. A bolometer is typically formed on a substrate or wafer and includes an absorber element for absorbing infrared radiation and a transducer element in thermal contact with the absorber element that has an electrical resistance that varies with temperature. In operation, infrared radiation incident upon the bolometer is absorbed by the absorber element, and heat generated by the absorbed radiation is transferred to the transducer element. As the transducer element heats in response to the absorbed radiation, the electrical resistance of the transducer element will change in a predetermined manner. By detecting changes in the electrical resistance, a measure of the incident infrared radiation can be obtained.

In previously known bolometer infrared sensors, as depicted in FIG. 2, the absorber element 102 of the bolometer 100 is typically integrated into a support structure that is suspended above the surface of the substrate 104. In some previously known sensors, the absorber element and the support structure are formed of the same material and deposited onto the substrate at the same time. The absorber element and support structure are deposited onto a patterned sacrificial layer which is then removed beneath the support structure so that the absorber element and support structure are suspended at the same level above the substrate. Upon removal, the absorber element and support structure are suspended above the substrate by support arms 106 that have an L-shaped configuration.

While effective for suspending the absorber element and support structure above the substrate, stress in the absorber element and support structure can result in buckling and shifting of the absorber element. Buckling and shifting of the absorber can result in reduced planarity, or flatness, of the absorber and can cause a non-uniform spacing between the absorber and the substrate which can adversely impact the accuracy and consistency of the sensor. In addition, the L-shaped arms 106 reduce the fill factor of the device.

DRAWINGS

DESCRIPTION

Figure 1:
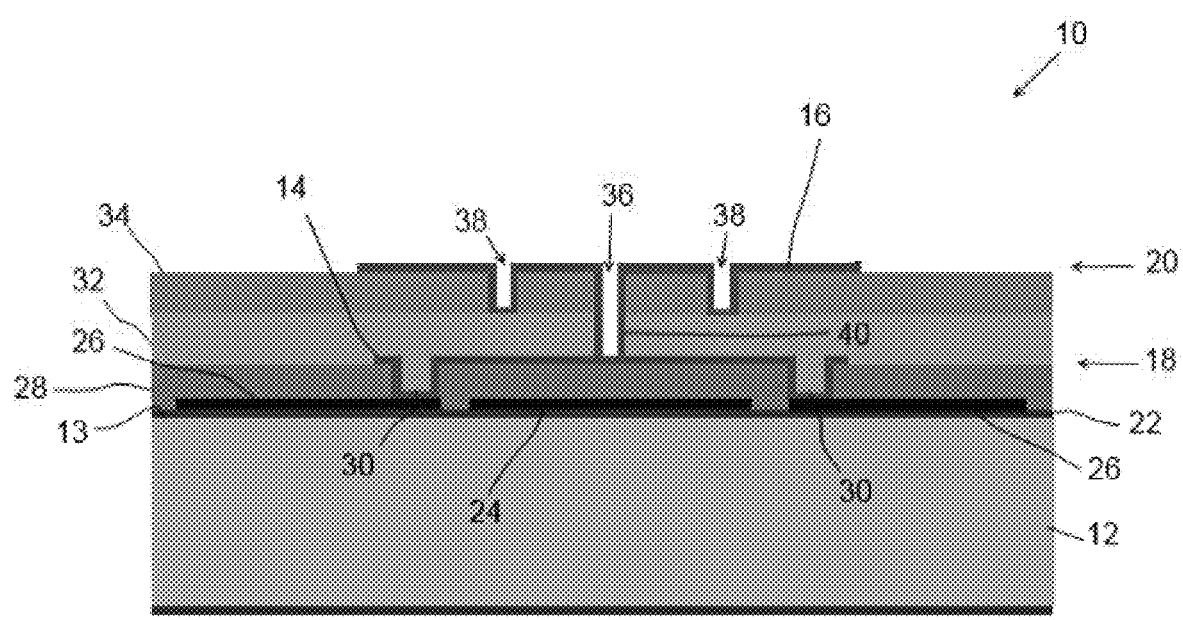
FIG. 1 is a cross-sectional view of a bolometer sensor having an absorber structure and suspension structure suspended at two different levels in relation to the substrate prior to the final removal of the sacrificial layers.
Figure 2:
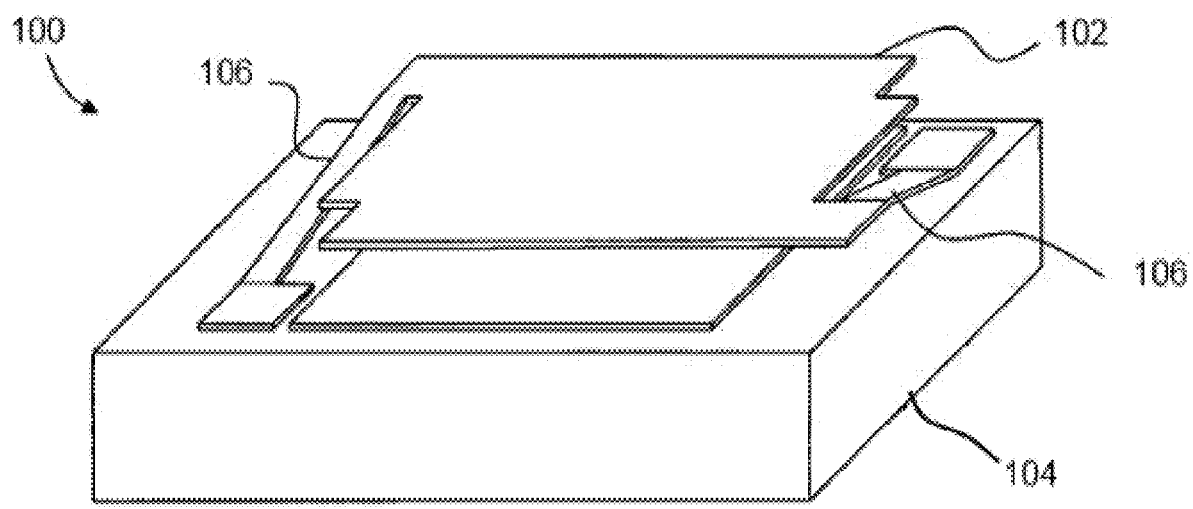
FIG. 2 is a perspective view of a bolometer in accordance with the prior art.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

In one embodiment, a semiconductor device includes a substrate having an upper surface that defines a sensing region. A fixed beam structure is supported at a first level above the sensing region. The fixed beam structure includes fixed beam supports that extend upwardly from the upper surface of the substrate to position the fixed beam structure at the first level above the sensing region. An absorber structure is supported above the fixed beam structure at a second level above the sensing region. The absorber structure includes a pillar support that extends upwardly from the fixed beam structure to position the absorber structure at the second level above the sensing region.

In another embodiment, a method of fabricating a semiconductor device includes depositing a first sacrificial layer onto a patterned conductive layer provided on an upper surface of a substrate with the upper surface of the first sacrificial layer located at a first level above the substrate. The first sacrificial layer is patterned to define anchor holes that extend down to the patterned conductive layer. A first conductive material is then deposited onto the first sacrificial layer and into the anchor holes to form a fixed beam structure and fixed beam supports, respectively, with the fixed beam structure being at the first level above the substrate. At least one additional sacrificial layer is then deposited on the first conductive material with the upper surface of the at least one additional sacrificial material located at a second level above the substrate. The at least one additional sacrificial layer is then deposited to form a pillar hole that extends down to the fixed beam structure. A second conductive material is then deposited onto the at least one additional sacrificial layer and in the pillar hole to form an absorber structure and a pillar support, respectively, with the absorber structure being at the second level above the substrate.

FIG. 1 depicts a perspective view of an embodiment of a semiconductor device 10 in accordance with the present disclosure. The semiconductor device 10 comprises a bolometer infrared sensor. Such a sensor is useful in a variety of applications including temperature sensors, IR sensors, IR sensor arrays, thermal imagers, night vision cameras, remote temperature sensing, and the like. The sensor 10 includes a substrate 12, a fixed beam suspension structure 14, and an absorber structure 16. As can be seen in FIG. 1, the fixed beam suspension structure 14 is configured to be suspended predominately at a first level 18 above the surface of the substrate 12 in a tethered beam, or fixed beam, configuration, i.e., each end of the structure is fixed, or tethered, to the surface of the substrate. The absorber structure 16 is configured to be suspended predominately at a second level 20 which is above both the surface of the substrate and the fixed beam suspension structure.

In the embodiment of FIG. 1, the substrate 12 comprises an oxidized silicon wafer. A conductive layer is formed on the surface of the substrate, or in this case, formed on a thin $SiO_2$ layer 22 on the surface 13 of the substrate 12. The conductive layer is patterned, e.g., by etching, to form a reflector structure 24 and readout conductors 26. The reflector 24 is used to reflect infrared radiation that reaches the substrate back up toward the absorber. The readout conductors 26 are used to connect the sensor to readout circuitry (not shown).

A first sacrificial layer 28 is deposited on the substrate 12 over the patterned conductive layer. The first sacrificial layer is deposited at a thickness that corresponds to the desired height of the suspension structure above the substrate. A fixed beam mask (not shown) is used to define the configuration of suspension structure 14 on the first sacrificial layer. For example, the fixed beam mask is used to define positions for anchor holes 30 to be etched through the first sacrificial layer 28 down to the readout conductors 26. The anchor holes 30 will define the anchors, or fixed beam supports, for the suspension structure 14. The first sacrificial layer 28 may be formed of any suitable type of material and etched in a manner appropriate for that material. In the embodiment of FIG. 1, the first sacrificial layer is formed of polysilicon.

The suspension structure 14 for the sensor 10 is deposited onto the first sacrificial layer 28 such that it conformally follows the contours of the anchor holes 30.

The suspension structure is formed of a suitable conductive material, such as platinum, deposited in any suitable manner. The portions of the suspension structure 14 that are deposited into the anchor holes 30 form fixed beam supports for suspending each side of the suspension structure 14 a predetermined distance (defined by the thickness of the first sacrificial layer) above the substrate 12. The fixed beam supports are also electrically connected to the readout conductors 26 at the base of the anchor holes 30 to connect the absorber structure to the readout circuitry (not shown). In one embodiment, the suspension structure 14 comprises a thin film structure deposited using an atomic layer deposition (ALD) process which enables very thin films to be formed with precise and uniform thickness control.

After the suspension structure 14 is formed on the first sacrificial layer 28, at least one additional sacrificial layer is deposited on the suspension structure 14 to a thickness that positions the upper surface of the additional sacrificial layer(s) at the second level above the substrate. In the embodiment of FIG. 1, the additional sacrificial layer(s) includes a second sacrificial layer 32 is deposited over the sensor structure 14. The second sacrificial layer 32 is formed of a material having different etching characteristics than the first sacrificial layer so that the second sacrificial layer can be etched without etching or damaging the suspension structure or first sacrificial layer. In one embodiment, the second sacrificial layer is formed of a first photoresist material.

A third sacrificial layer 34 is then formed on top of the second sacrificial layer 32. The third sacrificial layer is formed of a material having different etching characteristics than the second sacrificial layer so that the third sacrificial layer can be etched without etching or damaging the second sacrificial layer. In one embodiment, the third sacrificial layer is formed of a second photoresist material.

An absorber mask (not shown), formed of a material such as polyimide (PI), is used to define the absorber structure 16 on the third sacrificial layer 34. For example, the absorber mask is used to define a position for a pillar hole 36 to be etched through the third and second sacrificial layers 32, 34 down to the suspension structure 14. Additional features may be etched into the third sacrificial layer, such as trenches 38 for defining folds or corrugations in the absorber structure 16 to add mechanical stability. A first etching process is then performed to etch the third sacrificial layer 34 down to the second sacrificial layer 32 in the pillar region to form a first portion of the pillar hole 36 and in other regions where the mechanical stability features 38 are defined. A second etching process is performed to etch the second sacrificial layer 32 in the pillar region down through to the suspension structure 14.

The absorber structure 16 for the sensor 10 is deposited onto the third sacrificial layer 34 such that it conformally follows the contours of the pillar hole 36 and mechanical stability trenches 38. The absorber structure 16 is formed of a suitable conductive material, such as platinum, deposited in any suitable manner. In one embodiment, the absorber structure 16 comprises a thin film structure deposited using an atomic layer deposition (ALD) process. The portions of the absorber 16 that are deposited into the pillar hole 36 form a pillar structure 40 that is used to support the absorber structure above the suspension structure. The pillar structure 40 is electrically/thermally connected to the suspension structure 14 at the base of the pillar hole 36.

In the embodiment of FIG. 1, the second and the third sacrificial layers 32, 34 are deposited at a total thickness that corresponds to the desired spacing between the suspension structure 14 and the absorber structure 16. The second sacrificial layer and the third sacrificial layer thicknesses are selected based on the desired dimensions of any non-planar features, such as the mechanical stability features, that are incorporated into the absorber structure. In alternative embodiments, mechanical stability features may be omitted so that a single sacrificial layer is space the absorber structure above the suspension structure rather than the use of two sacrificial layers as depicted in FIG. 1.

Once the absorber structure 16 has been deposited onto the third sacrificial layer 34, the second and third sacrificial layers 32, 34 are removed to release the absorber structure 16 so that the absorber structure 16 is suspended above the suspension structure 14 by the pillar structure 40. The first sacrificial layer 28 is then removed to release the suspension structure 14 so that the suspension structure is suspended above with the substrate by the fixed beam supports.

As can be seen in FIG. 1, the pillar structure 40 is centered in the absorber structure 16 so that the absorber structure 16 includes two lateral extending portions that extend outwardly from the top of the pillar structure. This configuration has advantages over previously known bolometer sensor configurations. For example, one narrow point of contact is provided between the absorber structure and the suspension structure which helps thermally isolate the absorber structure as well as decouple the absorber structure from stresses that may be induced in the fixed beam suspension structure.

The separated configuration of the absorber structure and suspension structure also enables two different materials with different characteristics or the same material deposited with different characteristics to be used for the suspension and absorber structures. In addition, the separated configuration also enables the supports for the suspension structure to be larger without having to reduce the fill factor.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A semiconductor device comprising:
 a substrate having an upper surface that defines a sensing region;

a patterned conductive layer on the upper surface of the substrate;

a fixed beam structure formed of a first conductive material and supported at a first level above the sensing region, the fixed beam structure including a first fixed beam support and a second fixed beam support that extend upwardly from the upper surface of the substrate to position the fixed beam structure at the first level above the sensing region, the fixed beam structure being electrically connected to the patterned conductive layer by the first and the second fixed beam supports; and an absorber structure formed of a second conductive material and supported above the fixed beam structure at a second level above the sensing region, the absorber structure including a single pillar support that extends upwardly from the fixed beam structure to position the absorber structure at the second level above the sensing region, wherein the first fixed beam support extends upwardly from the upper surface of the substrate at a first position located on a first side of the sensing region and the second fixed beam support extends upwardly from the upper surface of the substrate at a second position on a second side of the sensing region that is opposite from the first side, the first and the second positions being spaced laterally apart from each other such that a central portion of the fixed beam support is suspended over the sensing region between the first fixed beam structure and the second fixed beam structure, the pillar support of the absorber structure extending upwardly from the central portion of the fixed beam structure.

2. The device of claim 1, wherein the pillar support electrically connects the absorber structure to the fixed beam structure.

3. The device of claim 2, further comprising:
a reflector structure formed on the upper surface of the substrate in the sensing region.

4. The device of claim 3, further comprising:
a first sacrificial layer deposited on the patterned conductive layer and patterned to define anchor holes down to the patterned conductive layer, and
wherein the first conductive material is deposited on the first sacrificial layer and in the anchor holes to form the fixed beam structure and the fixed beam supports, respectively.

5. The device of claim 3, further comprising:
at least one additional sacrificial layer deposited on the fixed beam structure and patterned to define a pillar hole that extends down to the fixed beam structure, and
wherein the second conductive material is deposited on the at least one additional sacrificial layer and in the pillar hole to form the absorber structure and the pillar support, respectively.

6. The device of claim 5, wherein the first conductive material and the second conductive material each comprise an atomic layer deposition (ALD) of a metal material.

7. The device of claim 6, wherein the metal material comprises platinum.

8. The device of claim 5, wherein the first sacrificial layer is formed of polysilicon.

9. The device of claim 8, wherein the at least one additional sacrificial layer is formed of a photoresist material.

10. The device of claim 5, wherein the first conductive material and the second conductive material are different.

11. The device of claim 3, wherein the absorber structure forms a bolometer infrared sensor.

12. The device of claim 1, wherein the pillar support is centered substantially on the fixed beam structure.

* * * * *